United States Patent [19]
McKinnon et al.

[11] Patent Number: 6,070,095
[45] Date of Patent: May 30, 2000

[54] METHOD FOR REDUCING TRANSLATIONAL MOTION ARTIFACTS IN MR IMAGING

[75] Inventors: Graeme C. McKinnon, Hartland; Xiaohong Zhou, Pewaukee, both of Wis.

[73] Assignee: General Electric Company, Milwaukee, Wis.

[21] Appl. No.: 09/089,205

[22] Filed: Jun. 2, 1998

[51] Int. Cl.[7] .................................................. A61B 5/055
[52] U.S. Cl. ........................... 600/410; 600/414; 382/278
[58] Field of Search ........................... 600/410, 414–417, 600/421, 534; 324/306–309, 207.22, 207.24, 207.11; 606/130; 382/278, 280, 291

[56] References Cited

U.S. PATENT DOCUMENTS

| | | | |
|---|---|---|---|
| 5,005,578 | 4/1991 | Greer et al. | 128/653 A |
| 5,379,766 | 1/1995 | McKinnon et al. | 128/653.2 |
| 5,394,457 | 2/1995 | Leibinger et al. | 378/162 |
| 5,539,312 | 7/1996 | Fu et al. | 324/309 |
| 5,632,276 | 5/1997 | Eidelberg et al. | 128/653.1 |
| 5,769,789 | 6/1998 | Wang et al. | 600/414 |
| 5,850,486 | 12/1998 | Maas, III et al. | 382/294 |

*Primary Examiner*—Marvin M. Lateef
*Assistant Examiner*—Shawna J Shaw
*Attorney, Agent, or Firm*—James O. Skarsten; Christian G. Cabou; Phyllis Y. Price

[57] ABSTRACT

A method is provided for correcting for effects of translational motion or movement of an object in MR imaging. In accordance with the method, an MR point source is joined to the object for translational movement in unison therewith, the point source being maintained in selectively spaced-apart relationship with the object. The method further comprises acquiring a set of k-space data representing images of the object and point source collectively, and deriving a function representing the square of the magnitude of the k-space data set. An inverse Fourier transform operation is applied to the derived function to generate a correlation function with a number of correlation components, a specified one of the correlation components comprising the cross-correlation of the object and the point source. All of the correlation components are then discarded, except for the specified correlation component, which provides an adjusted MR image representing the object from which effects of the translational motion have been substantially eliminated.

19 Claims, 4 Drawing Sheets

METHOD FOR REDUCING TRANSLATIONAL MOTION ARTIFACTS IN MR IMAGING

BACKGROUND OF THE INVENTION

The invention disclosed and claimed herein generally pertains to a method for reducing artifacts in acquired magnetic resonance (MR) images, wherein the artifacts result from translational motion of a patient or other object of imaging. More particularly, the invention pertains to a method of such type wherein the motion is small, in comparison with the spatial resolution of acquired images.

In conventional MR imaging, scan time can typically last from a few seconds to several minutes. During this time, it is very common for translational motion to occur in a body part being imaged, resulting in inconsistent k-space phase errors. MR imaging is very sensitive to such errors, which can cause blurring, ghosting, or other artifacts in a reconstructed image. Translational motion may result from involuntary patient movement or from restlessness, particularly in the case of pediatric patients, and may thus be very difficult to prevent. Such motion tends to be both non-periodic and unpredictable. Accordingly, a technique known in the art as gating, which has been used in the past to compensate for periodic motion in MR imaging, is not useful in connection with translational motion as described above. The gating technique, wherein data acquisition is synchronized with motion, is discussed, for example, by W. J. Rogers, Jr. and E. P. Shapiro in "Effect of RR interval variation on image quality in gated, two-dimensional, Fourier MR Imaging", Radiology, vol. 186, pp. 883–887 (1993).

In another motion correction technique, known as navigator echo correction, an additional echo is acquired in the same pulse sequence that acquires the k-space data. This echo, referred to as a navigator echo, is used to determine the instantaneous position of the object when the sequence is played out, and subsequently to correct the k-space data acquired by the same sequence, or to re-acquire the motion-contaminated k-space data should motion exceed a predetermined threshold. The navigator technique is described, for example, by R. L. Ehman and J. P. Felmlee, Radiology, vol. 173, pp. 2555–263 (1989), and by Z. W. Fu, et al., Magn. Reson. Med., vol. 34, pp. 746–753 (1995). The use of navigator echoes always requires additional data which can lead to longer imaging time.

In view of the above deficiencies of the prior art, it would clearly be desirable to provide an improved technique for correcting errors in MR imaging which result from non-periodic translational motion, wherein the correction technique is comparatively simple, and does not significantly increase data acquisition.

SUMMARY OF THE INVENTION

The present invention is directed to a method for correcting or compensating for effects of translational motion of an object of MR imaging. More particularly, the method of the invention is concerned with translational motion which is small in comparison with the spatial resolution of the acquired images. Thus, the motion can be treated as bulk motion of the object to be imaged. The method comprises the steps of positioning an MR point source in close, spaced-apart relationship with the object; ensuring the point source to experience the same translational motion as the object; and acquiring a set of k-space data which represents an image of the object and an image of the point source, collectively. The method further comprises deriving a function which represents the square of the magnitude of the k-space data set, and then applying an inverse Fourier transform operation to the function to generate a correlation function with a number of components, wherein a specified one of the correlation components comprises the cross-correlation of the object and the point source. All of the correlation components are discarded, except for the specified correlation component, which provides an adjusted MR image from which effects of the translational motion have been substantially eliminated.

In a preferred embodiment of the invention, the step of applying translational motion comprises joining the point source to the object for movement in unison therewith, such as by fixing the point source to the object by means of a rigid, elongated member. In one useful embodiment, if the object resides within a rectangular field of view having a length L, the point source must be separated from the center of the field of view by a distance which is no less than 3L/2. Moreover, the k-space data acquisition step for such embodiment has an associated sampling rate which is at least four times greater than the minimum sampling rate necessary to acquire a set of MR data of the object by itself.

In a second useful embodiment, wherein the point source is spaced apart from the object by a distance r, the object again resides within a rectangular field of view having a length L, and MR data pertaining to the object and the point source is acquired in association with a readout gradient $G_{ro}$. MR data pertaining to the object and the point source are acquired separately, and at substantially the same resonance frequency. The frequencies of the object and point source MR data are then shifted with respect to each other by mixing one or both sets of MR data with a reference signal, such that the resulting frequency difference is $[(3L/2)-r] \gamma G_{ro}$, where $\gamma$ is the gyromagnetic ratio. For protons $\gamma=4.25$ $KH_z/Gauss$.

OBJECTIONS OF THE INVENTION

An object of the invention is to provide an improved method for correcting errors in acquired MR data, wherein the errors result from translational motion of the patient or other object of imaging.

Another object is to provide a method of the above type which is comparatively simple, and which does not significantly increase data acquisition time.

Another object is to provide a method of the above type, wherein the translational motion is small in comparison with the spatial resolution of the acquired MR images.

These and other objects and advantages of the invention will become more readily apparent from the following description, taken together with the accompanying drawings.

DETAILED DESCRIPTION OF THE PREFERRED EMBODIMENT

Figure 1:
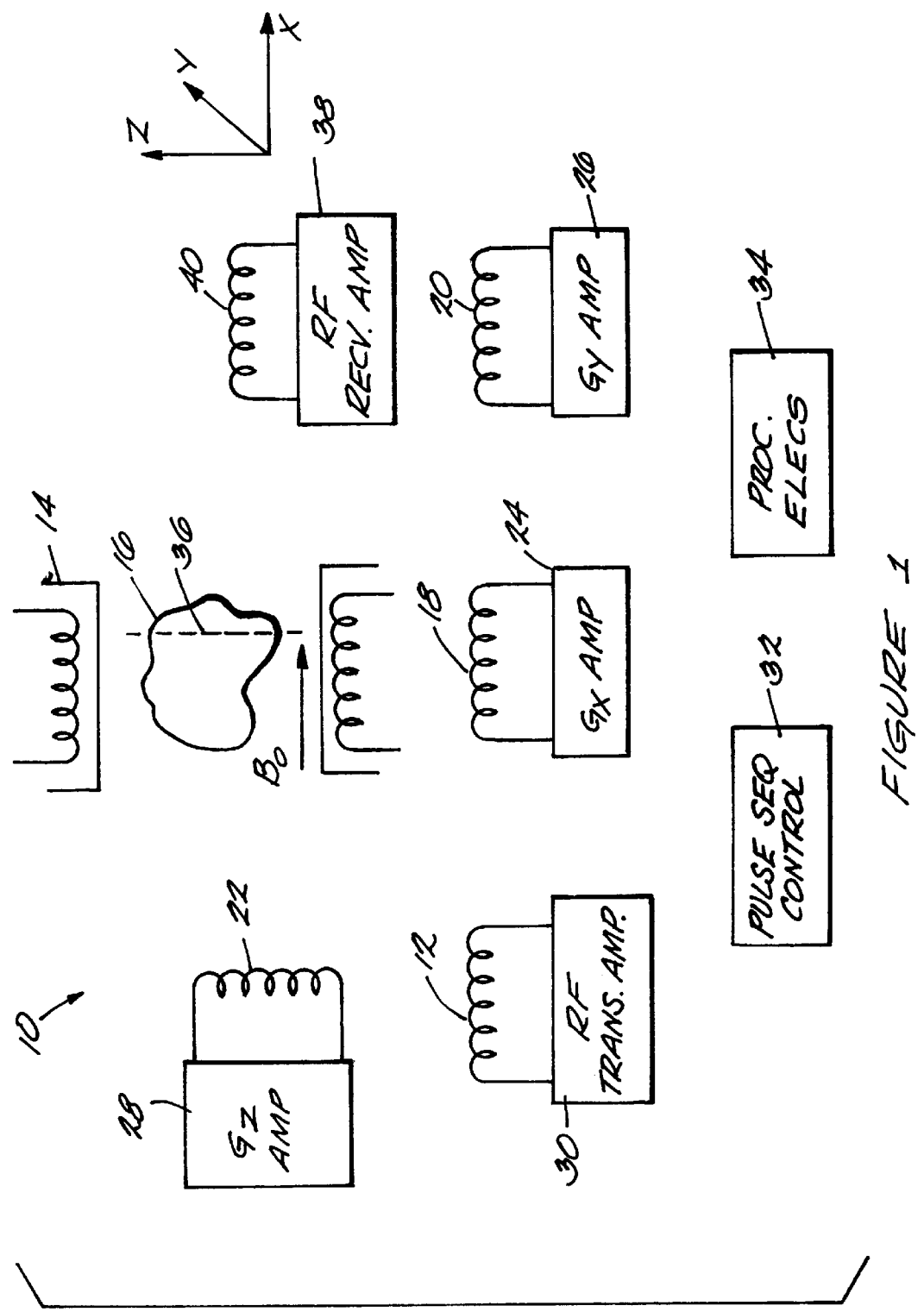
FIG. 1 is a schematic diagram showing basic components of an MR system for use in practicing embodiments of the invention.

Referring to FIG. 1, there are shown the basic components of an MR system 10 which may be operated to acquire MR data, and to correct motion-induced errors in the data as described herein. System 10 includes an RF transmit coil 12, as well as a magnet 14 for generating a main or static magnetic field $B_o$ in the bore of a cylindrical magnet. RF coil 12 is operated to transmit RF excitation signals into a patient or other object of imaging 16 residing in the magnet bore, in order to produce MR signals. System 10 further includes gradient coils 18, 20 and 22 for generating $G_x$, $G_y$, and $G_z$, magnetic field gradients relative to orthogonal X-, Y- and Z-reference axes, respectively. FIG. 1 shows each of the gradient coils 18, 20 and 22 respectively driven by gradient amplifiers 24, 26 and 28, and RF coil 12 driven by transmit amplifier 30.

Referring further to FIG. 1, there is shown system 10 provided with an RF coil 40, which is operated in association with a receive amplifier 38 to acquire MR signals from object 16, such as from a slice 36 therethrough. Coil 40 comprises a local or volume coil which is disposed to contain object 16, or a portion thereof which is of interest for imaging. System 10 is further provided with a pulse sequence control 32, which is operated to control the RF and gradient amplifiers, and to thereby generate pulse sequences to produce and acquire sets of MR signals. System 10 also includes computation and processing electronics 34, for applying the method of the invention to correct errors in the acquired data, wherein the errors result from translational motion of the object 16. The construction, functions, and interrelationships of the respective components of MR system 10 are well known and described in the prior art, such as in U.S. Pat. No. 5,672,969, issued Sep. 30, 1997 to Zhou et al.

In one embodiment of the invention, described hereinafter in connection with FIG. 5, MR system 10 is further provided with a small RF point source coil.

Figure 2:
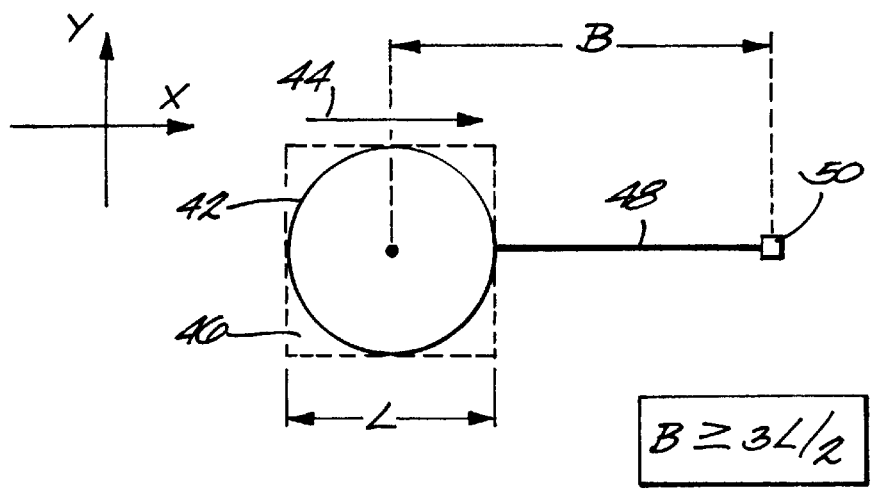
FIG. 2 is a schematic diagram showing the spatial relationship between an object of MR imaging and an MR point source for implementing an embodiment of the invention.

Referring to FIG. 2, there is shown an object 42, such as a patient's head or the like, disposed for MR imaging. Object 42 is subject to translational motion, which solely for purposes of illustration is limited to motion along the X-axis, as represented by arrow 44. However, it is to be emphasized that the invention generally applies to translational motion in any direction within the imaging plane, including motion having a component directed along the Y-axis. It is to be further noted that the translational motion is small in comparison with the spatial resolution of the acquired image. Object 42 is generically depicted in FIG. 2 as a circle residing within a rectangular field of view 46 having a length or extent L. FIG. 2 further shows an MR point source 50, which is positioned in spaced-apart relationship with object 42 at a distance B from the center thereof, and from the center of field of view 46. Point source 50 comprises a small phantom, such as a container of water having dimensions which are, for example, no greater than one-half of an image pixel (e.g., on the order of 1–3 mm), and is rigidly joined to object 42 for movement in unison therewith. For example, point source 50 and object 42 may be joined together by means of a stiff elongated rod 48 extending along the X-axis. Thus, the translational motion experienced by object 42 is also applied to point source 50. The spacing B between object 42 and point source 50 is relatively small compared to the RF coil so that an RF excitation signal applied to object 42, to produce and receive MR signals therein, will likewise produce and receive MR signals in point source 50. Accordingly, k-space data sets $I(k_x,k_y)$ and $H(k_x,k_y)$, respectively representing images of object 42 and point source 50, may be acquired by conventional operation of MR system 10. The functions $I(k_x, k_y)$ and $H(k_x, k_y)$ comprise the spatial frequencies of the object and point source, respectively.

For translational motion limited to motion along the X-axis, as given in the above example, object 42 is displaced by $\Delta x$, and point source 50 is likewise displaced by $\Delta x$. (although there would also be a $\Delta y$ displacement if the translational motion included a component directed along the Y-axis). Such displacement may be represented in the above k-space expressions as a phase error term, i.e., as $I(k_x,k_y)e^{-ik_x\Delta x}$ for the object and as $H(k_x,k_y)e^{-ik_x\Delta x}$ for the point source. The two k-space data sets are usefully combined as follows:

$$I(k_x,k_y)e^{-ik_x\Delta x}+H(k_x,k_y)e^{-ik_x\Delta x}=F(k_x,k_y)e^{-ik_x\Delta x} \qquad \text{Eqn. (1)}$$

$F(k_x,k_y)e^{-ik_x\Delta x}$ is thus a single function collectively representing k-space data of both object 42 and point source 50. Since only translational motion is considered, the magnitude of the k-space data (i.e., the spatial frequencies of the object) remains unaffected by the motion. It is only the phase that depends on the displacement of the object. Thus, in accordance with the invention, an image of the object may be reconstructed by employing only the magnitude of the k-space data, from which effects of displacement resulting from translational motion have been eliminated. Such elimination is usefully achieved by first squaring the magnitude of k-space data $F(k_x,k_y)e^{-ik_x\Delta x}$, which may be carried out by multiplying such function by its conjugate $F^*(k_x,k_y)e^{+ik_x\Delta x}$ as follows:

$$[F(k_x,k_y)e^{-ik_x\Delta x}][F^*(k_x,k_y)e^{+ik_x\Delta x}]=|F(k_x, k_y)|^2 \qquad \text{Eqn. (2)}$$

The operation of Equation (2) removes the phase error term caused by translational motion, and provides an expression representing only the magnitude of the k-space data. The next step of the invention is to perform an inverse Fourier Transform on the expression of Equation (2). This has the effect of convolving, or producing an auto-correlation of, the image of the object and point source in real space. This may be represented as follows:

$$|F(k_x, k_y)|^2 \xrightarrow{FT} f \otimes f \qquad \text{Eqn. (3)}$$

where $\otimes$ represents an auto-correlation operation.

Figure 3:
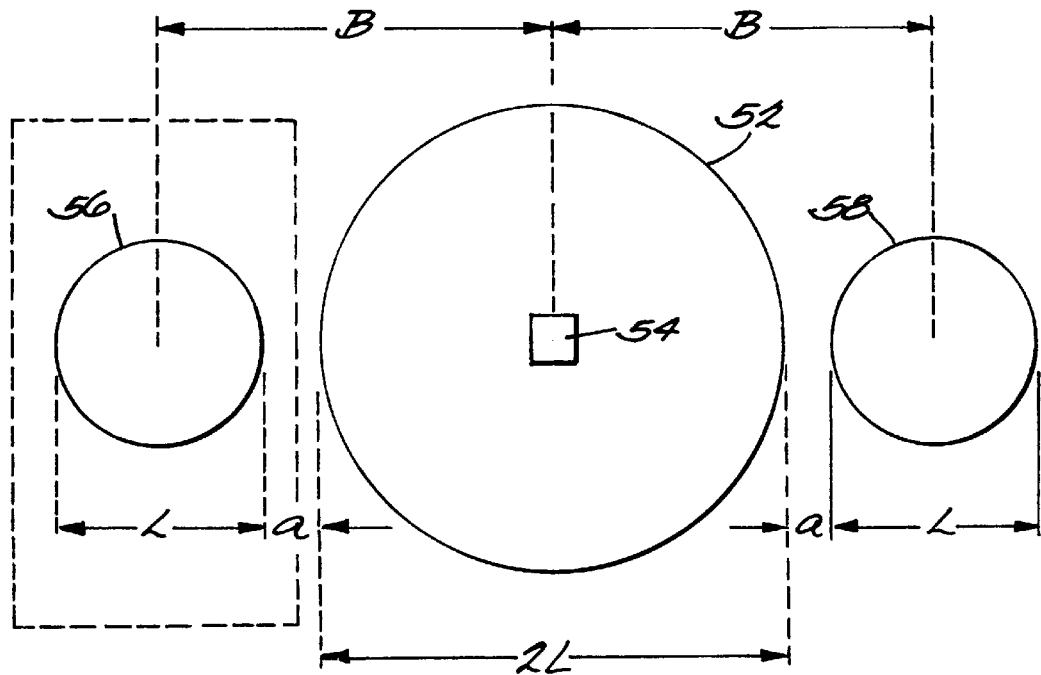
FIG. 3 is a schematic diagram useful for illustrating principles of the invention.

The operation of Equation (3) produces four mathematical components, each having an image component corresponding thereto. Each image component may be generated from its corresponding mathematical component to illustrate the auto-correlation of object 42 and of point source 50. Referring to FIG. 3, there are shown image components 52 and 54, depicting the auto-correlation of object 42 and the auto-correlation of point source 50, respectively. To the left and right sides of component 52, as viewed in FIG. 3, are identical image components 56 and 58, each comprising the cross-correlation of point source 50 and object 42. As is well known, the cross-correlation of an object and a point is the same as the object itself. Moreover, sufficient spacing is provided between the point source and the object to insure that there is spatial separation between the three correlation products, i.e., between each of the cross-correlation components 56 and 58 and the auto-correlation component 52. As shown by FIG. 3, providing such separation enables the two components 56 and 58 to be unaffected by the auto-correlations 52 and 54. Since each of the cross-correlation image components 56 and 58 depicts the object 42, unaffected by translational motion, the mathematical component from Equation (3) corresponding to either of such components (for example, component 56) may be employed to generate an image of object 42, with the remaining components being discarded. Thus, an image of object 42, free of translational motion effects, may be readily recovered from magnitude k-space data.

As stated above, image component 56 is a convolution of the point source 50 and the object 42. In principle if the point source was very well characterized, its characterization could be used to deconvolve the convolution product to obtain a sharper image. This might allow a relaxation of the point source size requirements, so that a larger point source could potentially be used.

In order to insure that the correlation components 56 and 58 are separated from components 52 and 54, it is first noted that the extent of auto-correlation component 52 of FIG. 3 is 2L, for an object field of view of length L. It will be noted further from FIG. 3 that the distance between component 54, representing the point source auto-correlation, and the centers of each of the components 56 and 58, each representing object 42, is the same spacing B shown in FIG. 2 between point source 50 and the center of object 42. Accordingly, components 56 and 58 will be separated from component 52 (i.e., will not overlap such component) as long as B is equal to or greater than 3L/2, that is B≧3L/2.

In order to prevent aliasing, the sampling bandwidth must also be selectively greater than the sampling bandwidth encountered in a conventional arrangement. Referring again to FIG. 3, it is seen that the total extent of the auto-correlation of point source 50 and object 42 is 4L+2a, where a is the separation between auto-correlation component 52 and components 56 and 58. The total extent of 4L+2a comprises an effective field of view for data acquisition and initial image reconstruction. Thus, the sampling rate must be equal to (if a=0), or preferably greater than, four times the rate required for the object itself since the object field of view is L. If the point source were to be placed outside the object in the readout direction, then there would be no increase in required scan time. There would only be more data points collected, or increased field of view. While the extent of the auto-correlation also increases in a direction perpendicular to a line between the point source and the object, such increase is only of concern for the central auto-correlation of the object. Accordingly, aliasing in this direction, i.e., the Y-direction (or the phase-encoding direction) is acceptable.

Figure 4:
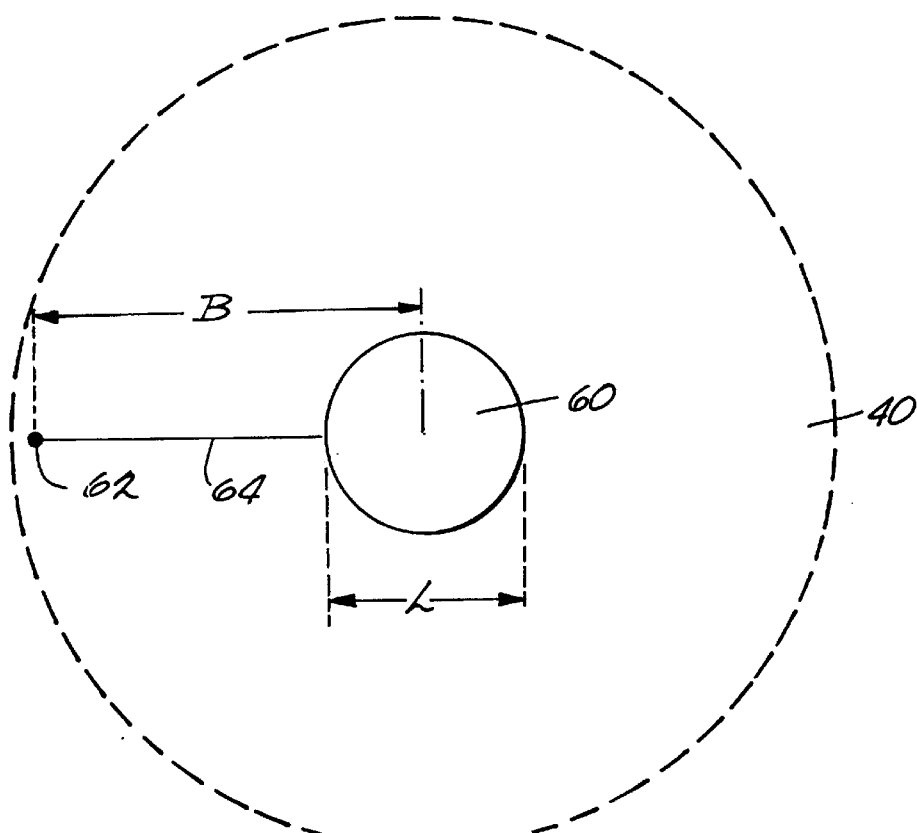
FIG. 4 is a schematic diagram illustrating an arrangement for practicing a first embodiment of the invention.

Referring to FIG. 4, there is shown an arrangement for implementing an embodiment of the invention described above. An object 60 which is subject to translational motion, such as a patient's head, is contained within a volume RF coil, such as RF receive coil 40 shown in FIG. 1. Object 60 is shown to have a field of view of length L, as likewise described above.

Referring further to FIG. 4, there is shown a point source 62 comprising a water phantom which is very small, e.g., is no greater than one-half the dimensions of an image pixel as previously stated. Point source 62 is firmly attached to object 60 by means of a stiff rod 64, which may be oriented in the direction of translational motion or other desired direction. In the embodiment of FIG. 4 the point source 62, as well as the object 60, is contained within the receive coil 40. Thus, MR signals produced in both object 60 and point source 62 are acquired by the same coil 40. Accordingly, it is essential that the spacing B between object 60 and point source 64 be equal to or greater than 3L/2, for the reasons previously described.

In the arrangement of FIG. 4, the signal to noise ratio (SNR) from the point source may be unacceptably small, if the point source is contained within the same volume coil which is used to acquire MR signals from the object. Moreover, if the object is a patient's head or the like, it may be inconvenient to attach the point source thereto by means of a rod which is long enough to provide a spacing of at least 3L/2 as described above. For example, if the dimension L for a patient's head was on the order of 20 centimeters, the point source would have to extend a minimum of 30 centimeters away from the head, and yet be contained within the same volume coil.

Figure 5:
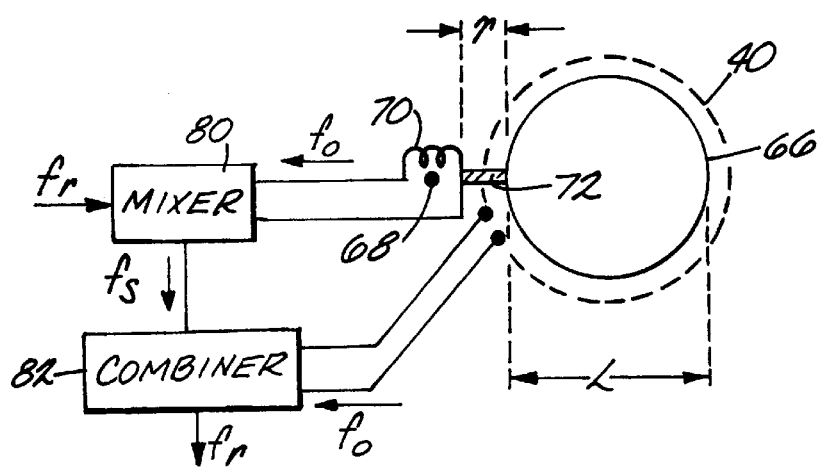
FIG. 5 is a schematic diagram illustrating an arrangement for practicing a second embodiment of the invention.

Accordingly, referring to FIG. 5, there is shown an alternative embodiment of the invention, which enables the actual spacing between an object of imaging and a point source to be substantially less than 3L/2, where L is the extent of the field of view of the object, as described above. FIG. 5 shows an object 66 again contained in a volume coil, such as RF receive coil 40, and having a field of view of length L. However, instead of a point source which is also located within the coil 40, the arrangement of FIG. 5 provides a point source coil 70. Coil 70 comprises a very small RF coil having the point source dimensions described above, i.e. no greater than one half of an image pixel, e.g., on the order of 1–3 mm. A point source phantom 68 is placed within the small coil 70, to produce MR signals in response to an RF excitation signal applied thereto and to object 66. Point source 68 and point source coil 70 are separated from object 66 by a spacing r, and are attached thereto by means of a member 72 which is comparatively short. It is to be emphasized that r may be substantially less than 3L/2, and may even be less than L.

Volume coil 40 is disposed to acquire MR data of object 66 at a resonance frequency $f_o$. Similarly, point source coil 70 is disposed to acquire MR data of point source 68 at the resonance frequency $f_o$. In order to insure a separation between the auto-correlation of object 66 and the cross-correlations of object 66 and point source 68, as described above in connection with FIG. 3, the MR signal from point source 70 is coupled to a mixer 80, which also receives a reference signal $f_r$. Mixer 80 shifts the frequency of point source MR data to a frequency $f_s$, where $f_s=f_o-f_r$, so that the frequencies of the object and the point source MR data are different. More particularly, the frequency $f_r$ is selected, relative to resonance frequency $f_o$, to produce a spatial shift such that a "pseudo separation" l is introduced between object 66 and point source 68, wherein the sum of l and r will be equal to or greater than 3L/2, that is:

$$l+r \geq 3L/2 \qquad \text{Eqn. (4)}$$

Given r and L, the necessary dimension of l may be readily determined from Eqn. (4). Knowing l and the resonance frequency $f_o$, reference frequency $f_r$ may be selected in accordance with the following relationship:

$$|f_r| \geq \gamma G_{ro} l \qquad \text{Eqn.(5)}$$

In Eqn. (5), $G_{ro}$ is the readout gradient employed in the acquisition of MR signal data pertaining to the object and point source, in accordance with conventional MR practice. γ is the gyromagnetic ratio of the spins. After shifting the frequency of the point source MR signal, both object and point source MR signals are summed in a combiner 82.

Thus, combiner 82 performs the data combining operation of Equation (1), set forth above.

Figure 6:
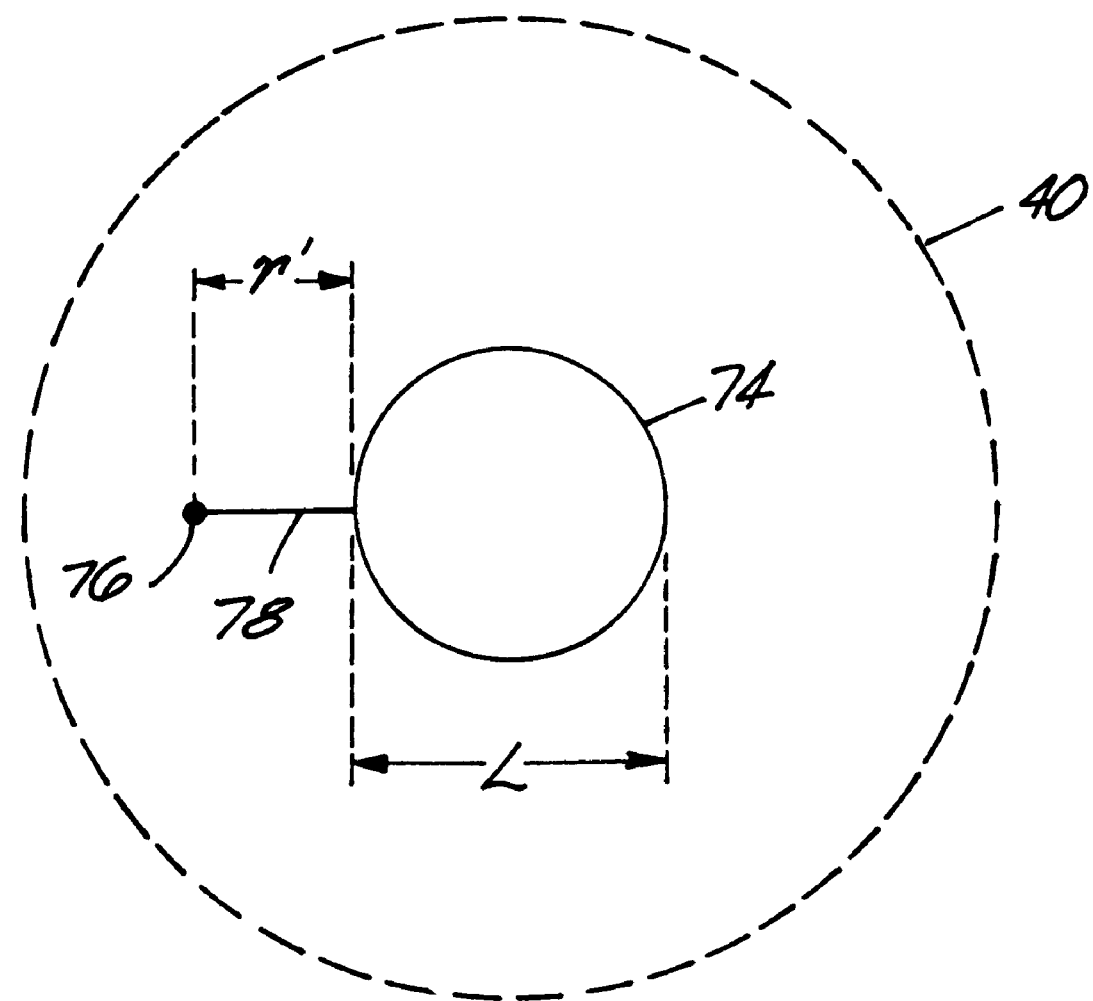
FIG. 6 is a schematic diagram illustrating an arrangement for practicing a third embodiment of the invention.

Referring to FIG. 6, there is shown an arrangement which is similar to the arrangement of FIG. 4, in that an object 74 of extent L and a point source 76 are both contained in a volume coil 40. However, the point source is spaced a distance r' from the object, by means of a rod 78 or the like, where r' is substantially less than 3L/2 or even than L. It is assumed that the object 74 contains material to be imaged which has a characteristic chemical shift or spectral frequency. For example, an object such as the head or other body part of a patient would contain water protons, having a characteristic resonance frequency $f_{water}$. Accordingly, in order to introduce a pseudo separation l', such that l'+r'≧3L/2, point source 76 is selected to comprise an MR responsive material other than water, having a chemical shift frequency $f_{shift}$ which is different from the characteristic frequency of water protons. More particularly, material for the point source is selected such that $|f_{water}-f_{shift}| \geq \gamma G_{ro} l'$. Thus, in the arrangement of FIG. 6, chemical shift is employed to achieve the required separation between auto-correlation of object 74 and the cross-correlations of object 74 and point source 76.

Obviously, many other modifications and variations of the present invention are possible in light of the above teachings. It is therefore to be understood that within the scope of the disclosed concept, the invention may be practiced otherwise than as specifically described.

What is claimed is:

1. A method for acquiring an MR image of an object disposed to experience translational motion, said method comprising the steps of:

positioning an MR point source in selected spaced-apart relationship with said object;

causing said point source to experience substantially the same translational motion as said object;

acquiring a set of k-space data representing an image of said object and an image of said point source, collectively;

deriving a function representing the square of the magnitude of said k-space data set;

applying an inverse Fourier transform operation to said function to generate a number of correlation components, a specified one of said correlation components comprising the cross-correlation of said object and said point source; and discarding all of said correlation components except said specified correlation component to provide an image of said object from which effects of said translational motion have been substantially eliminated.

2. The method of claim 1 wherein:

said method comprises employing said adjusted data set to construct an image of said object.

3. The method of claim 2 wherein:

said step of applying translational motion comprises fixing said point source to said object by means of a rigid elongated member.

4. The method of claim 3 wherein:

said k-space data acquisition step has an associated sampling rate which is no less than four times the minimum sampling rate necessary to acquire a set of MR data of said object alone.

5. The method of claim 1 wherein:

said step of applying translational motion comprises joining said point source to said object for movement in unison therewith.

6. The method of claim 1 wherein:

said object resides within a rectangular field of view having a length L; and said point source is separated from the center of said field of view by a distance which is no less than 3L/2.

7. The method of claim 1 wherein said adjusted data set has an associated image pixel, and wherein:

dimensions of said point source are on the order of one-half the dimensions of said image pixel.

8. The method of claim 1 wherein:

said object resides within a rectangular field of view having a length L, and said point source is spaced apart from said object by a spacing r;

said k-space data are acquired in association with a readout gradient $G_{ro}$, the data pertaining to said object is acquired at a first frequency, and the data pertaining to said point source is provided with a second frequency; and said first and second frequencies are respectively selected so that the absolute value of the difference therebetween is no less than the quantity $[(3L/2)-r]\gamma G_{ro}$.

9. The method of claim 8 wherein:

r is substantially less than L;

said object is positioned within a volume coil operated to acquire said data pertaining to said object at said first frequency;

said point source is positioned within a point source coil located outside of said volume coil at said spacing r from said object, said point source coil being operated to acquire said data pertaining to said point source at said first frequency; and after acquisition said data pertaining to said point source is shifted to said second frequency.

10. The method of claim 1 wherein:

said object resides within a rectangular field of view having a length L, said point source is spaced apart from said object by a spacing r, which is substantially less than said length L, and said k-space data is acquired in association with a readout gradient $G_{ro}$;

said object contains a first material to be imaged which has a first resonance frequency;

a second material is selected for said point source which has a second resonance frequency; and said second resonance frequency is selected so that the absolute value of the difference between said first and second frequencies is no less than the quantity $[3L/2)-r]\gamma G_{ro}$.

11. A method for acquiring an MR image of an object disposed to experience translational movement, wherein said object resides within a field of view having a length L, said method comprising the steps of:

joining an MR point source to said object for translational movement in unison therewith, said point source being maintained in spaced-apart relationship with said object at a spacing r;

acquiring a set of k-space data representing an image of said object and an image of set point source, collectively, a readout gradient $G_{ro}$ being applied to said object and to said point source as said data is acquired therefrom, said data acquired from said object having a first frequency $f_1$, and from said point source having a second frequency $f_2$;

respectively selecting said spacing r and said first and second frequencies to comply with the expression $[|f_1-f_2|/\gamma G_{ro}+r] \geq 3L/2$;

deriving a function representing the square of the magnitude of said k-space data set, and applying an inverse Fourier transform operation thereto in order to generate a number of correlation components, a specified one of said correlation components comprising the cross-correlation of said object and said point source; and discarding all of said correlation components except for said specified correlation component, said specified correlation component comprising an adjusted MR image representing said object from which effects of said translational movement have been substantially eliminated.

12. The method of claim 11 wherein:

said object and said point source are positioned in a common volume coil, said volume coil being operated to respectively acquire said data from both said object and said point source; and said frequencies $f_1$ and $f_2$ are equal, so that the difference therebetween is zero, and r is selected so that $r \geq 3L/2$.

13. The method of claim 12 wherein:

said k-space data acquisition step has an associated sampling rate which is no less than four times the minimum sampling rate necessary to acquire a set of MR data of said object alone.

14. The method of claim 11 wherein:

said object is positioned within a volume coil operated to acquire data from said object; and said spacing r is substantially less than L, and said frequencies $f_1$ and $f_2$ are selectively different from one another.

15. The method of claim 14 wherein:

said point source is positioned outside of said volume coil, and located within a point source coil which is spaced apart from said object at said spacing r.

16. The method of claim 15 wherein:

MR data is initially acquired from both said object and said point source at said frequency $f_1$; and MR data from said point source is thereafter shifted to said frequency $f_2$.

17. The method of claim 14 wherein:

said object contains a first material to be imaged having a first characteristic resonance frequency $v_1$; and a second material is selected for said point source which has a second characteristic resonance frequency $v_1$, where $|v_1-v_2|-f_1=f_2|$.

18. The method of claim 17 wherein:

said object and said point source are positioned in a common volume coil, said volume coil being operated to acquire data from both said object and said point source.

19. The method of claim 11 wherein said adjusted MR image has an associated image pixel, and wherein:

dimensions of said point source are on the order of one-half the dimensions of said image pixel.

* * * * *